(12) United States Patent
Wataya et al.

(10) Patent No.: US 6,392,309 B1
(45) Date of Patent: May 21, 2002

(54) SEMICONDUCTOR DEVICE INCLUDING SOLID STATE IMAGING DEVICE

(75) Inventors: Yukinobu Wataya; Hideto Isono, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/696,181

(22) Filed: Aug. 13, 1996

(30) Foreign Application Priority Data

Aug. 25, 1995 (JP) .............................. 7-240987

(51) Int. Cl.[7] .................. H01L 23/28; H01L 23/10; H01L 23/495; H01L 23/02
(52) U.S. Cl. .................. 257/796; 257/706; 257/707; 257/675; 257/680
(58) Field of Search ................. 257/706, 707, 257/796, 680, 675

(56) References Cited

U.S. PATENT DOCUMENTS

| | | | | |
|---|---|---|---|---|
| 3,922,775 A | * | 12/1975 | Potter ........................ | 29/589 |
| 4,914,551 A | * | 4/1990 | Anschel et al. ............. | 361/389 |
| 5,026,748 A | * | 6/1991 | Adams et al. ............... | 524/66 |
| 5,343,076 A | | 8/1994 | Katayama et al. .......... | 257/717 |
| 5,444,300 A | * | 8/1995 | Sato et al. .................. | 257/737 |
| 5,519,176 A | * | 5/1996 | Goodman et al. .......... | 174/255 |
| 5,594,282 A | * | 1/1997 | Otsuki ........................ | 257/796 |

FOREIGN PATENT DOCUMENTS

| | | | | |
|---|---|---|---|---|
| JP | 62-26847 | * | 2/1987 | ................ 257/796 |
| JP | 1-100955 | * | 4/1989 | ................ 257/706 |
| JP | 3-29366 | * | 2/1991 | ................ 257/706 |
| JP | 3252155 | * | 11/1991 | |
| JP | 6-85115 | * | 3/1994 | ................ 257/796 |
| JP | 6188341 | * | 7/1994 | ................ 257/796 |

* cited by examiner

Primary Examiner—Roy Potter
(74) Attorney, Agent, or Firm—Ronald P. Kananen, Esq.; Rader, Fishman & Grauer, PLLC

(57) ABSTRACT

A semiconductor device such as a solid state imaging device has a semiconductor chip mounted on a bottom surface of a cavity of a hermetic sealed box-shaped resin-molded package. The device comprises a radiator plate provided in a bottom wall of the package under the cavity or on the bottom surface of the cavity. The semiconductor chip and the radiator plate are bonded with an adhesive having a larger thermal conductivity than that of the resin forming the package. The radiator plate may be a part of a lead frame.

41 Claims, 4 Drawing Sheets

SEMICONDUCTOR DEVICE INCLUDING SOLID STATE IMAGING DEVICE

BACKGROUND OF THE INVENTION

1. Field of the Invention

This invention relates to a semiconductor device and a solid state imaging device, having a construction in which a semiconductor chip is mounted on the bottom of a hermetic sealed box-shaped resin-molded package.

2. Description of the Related Art

FIG. 1 shows a existing solid state imaging device in the related art comprising a CCD chip, used as a solid state imaging element 102, bonded with an adhesive 103 to the bottom surface in a cavity 101a of a resin-molded box-shaped package 101. Integrally extending from the package 101 are outer leads 104 and inner leads 105. Inner leads 105 are connected to a bonding pad (not shown) of the CCD chip 102 by wires 106. Thus, the outer leads 104 are electrically connected to the CCD chip 102. A transparent cap 107 of optical glass, for example, is bonded to the upper end of the package 101 by an adhesive 108 to hermetic seal the interior of the package 101.

A problem with the solid state imaging device in the related art is a bad moisture resistant property. The package 101 cannot effectively prevent infiltration of moisture into the cavity 101a through the bottom wall of the package 101. There is another solid state imaging device in the related art shown in FIG. 2, which has an improved moisture resistance.

In the solid state imaging device of FIG. 2, a part (called a depressed portion) of a lead frame used to make outer leads 104 and inner leads 105 is embedded under a cavity 101a of a resin-molded box-shaped package 101 to form a moisture resistant plate 109. In the other respects, the device of FIG. 2 is the same as the solid state imaging device of FIG. 1.

In the solid state imaging device of FIG. 2, the moisture resistant plate 109 prevents infiltration of moisture through the bottom of the package 101 into the cavity 101a, and thus improves the hermetic seal property of the solid state imaging device.

Another problem with the solid state imaging devices shown in FIGS. 1 and 2 is that the CCD chip 102 is bonded to the bottom in the cavity 101a of the package 101 which is made of a resin having a low thermal conductivity (for example, $2.1 \times 10^{-3} cal/cm.s.°C.$), resulting in that the heat generated from the CCD chip 102 during its operation is shut in the package 101 and increases the temperature of the CCD chip 102. An increase in temperature of the CCD chip 102 causes an increase in level of defects having a temperature characteristic and hence causes a deterioration in quality of images obtained by the solid state imaging devices.

The high temperature problem of chips during operation explained with reference to solid state imaging devices also applies to semiconductor devices, in general, using a package similar to the package 101.

OBJECT AND SUMMARY OF THE INVENTION

It is therefore an object of the invention to provide a semiconductor device which is alleviated in temperature increase of its semiconductor chip during operation.

It is another object of the invention to provide a solid state imaging device which is alleviated in temperature increase of its solid state imaging element during operation.

According to the invention, there is provided a semiconductor device having a semiconductor chip mounted on a bottom surface of a cavity of an hermetic sealed box-shaped resin-molded package, comprising:

a radiator plate provided in a bottom wall of the package under the cavity or on the bottom surface of the cavity; and the semiconductor chip and the radiator plate being bonded with an adhesive having a larger thermal conductivity than that of the resin forming the package.

According to the invention, there is also provided a solid state imaging device having a solid state imaging element on a bottom surface of a cavity in a hermetic sealed box-shaped resin-molded package, comprising:

a radiator plate provided in a bottom wall of the package under the cavity or on the bottom surface of the cavity; and the solid state imaging element and the radiator plate being bonded with an adhesive having a larger thermal conductivity than that of the resin forming the package.

According to the invention, there is further provided a semiconductor device having a semiconductor chip on a bottom surface of a cavity in a hermetic sealed box-shaped resin-molded package, comprising:

a radiator plate which is a part of a lead frame, the radiator plate being provided in the bottom wall of the package under the cavity or on the bottom surface of the cavity; and the semiconductor chip and the radiator plate being bonded with an adhesive having a larger thermal conductivity than that of the resin forming the package.

According to an aspect of the invention, the radiator plate is embedded in the bottom wall of the package under the cavity, and the semiconductor chip or the solid state imaging element is bonded to the radiator plate with the adhesive through an aperture formed in the bottom wall of the package in the cavity for access to the radiator plate.

According to another aspect of the invention, the radiator plate is provided on the bottom surface of the cavity, and the semiconductor chip or the solid state imaging element is bonded onto the radiator plate with the adhesive.

Usable as the resin forming the package are, for example, thermoset resins including epoxy resin, polyimide, silicone resin, phenolic resin, unsaturated polyester resin, and so forth.

The adhesive having a larger thermal conductivity than the resin of the package may include epoxy resin, imide resin, silicone resin or acrylic resin, for example, as its base material. Typically, the adhesive additionally contains a filler of silver (Ag) or other metal to increase the thermal conductivity.

When the radiator plate is provided on the bottom surface of the cavity in the package and the semiconductor chip or the solid state imaging element is bonded to the radiator plate with the adhesive, reflection of light from the surface of the radiator plate may adversely affect the operation of the semiconductor device or the solid state imaging device. To prevent this, the radiator plate is preferably coated with a light absorptive material such as chromium (Cr). Alternatively, reflection of light by the radiator plate can be prevented by adding a black pigment such as carbon to the adhesive and by applying the light absorptive adhesive to the surface of the radiator plate.

In a typical embodiment of the invention, the resin forming the package is epoxy resin, and the adhesive having a larger thermal conductivity than the resin of the package is epoxy resin containing a metal filler.

The radiator plate is typically a part of the lead frame, but may be a member independent from the lead frame. In the latter case, the radiator plate is bonded onto the bottom surface of the cavity of the package with the adhesive. Here again, the adhesive has a larger thermal conductivity than the resin of the package.

The radiator plate typically has a larger dimension than the semiconductor chip or the solid state imaging element for more effective radiation of heat.

The semiconductor device may be a solid state imaging device incorporating a solid state imaging element chip such as CCD chip, or may be a semiconductor IC device incorporating an IC chip or an LSI chip.

In the semiconductor device according to one or other aspect of the invention, heat from the semiconductor chip or the solid state imaging device during operation is quickly transferred to the radiator plate via the adhesive having a larger thermal conductivity than the package and is effectively radiated from the entirety of the radiator plate. Therefore, the temperature of the semiconductor chip or the solid state imaging element remains moderate during operation.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are described below with reference to the drawings.

Figure 1:
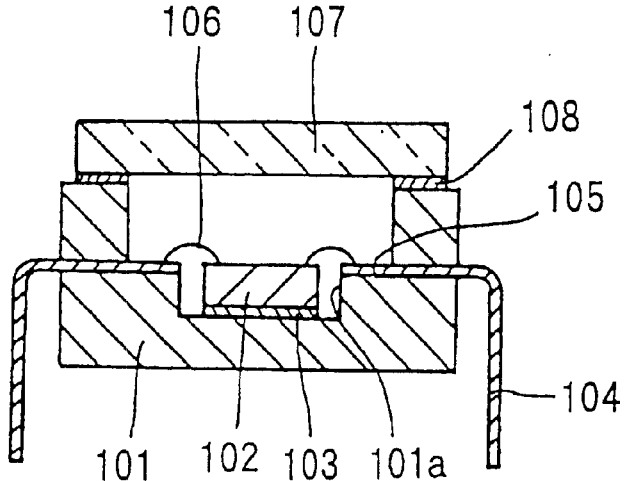
FIG. 1 is a cross-sectional view of a solid state imaging device in the related art.
Figure 2:
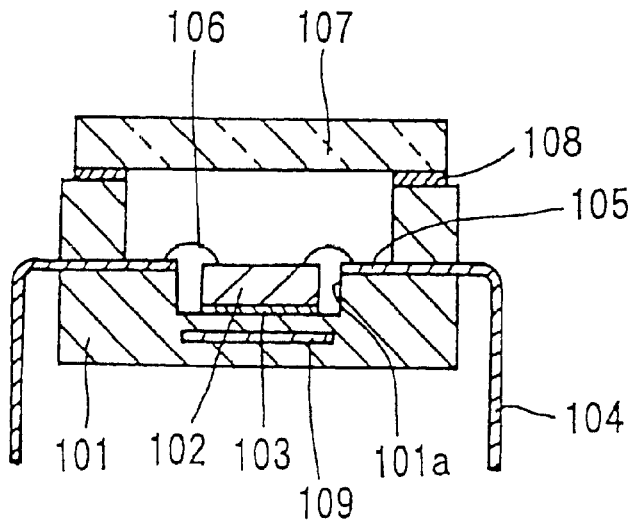
FIG. 2 is a cross-sectional view of another solid state imaging device in the related art.
Figure 3:
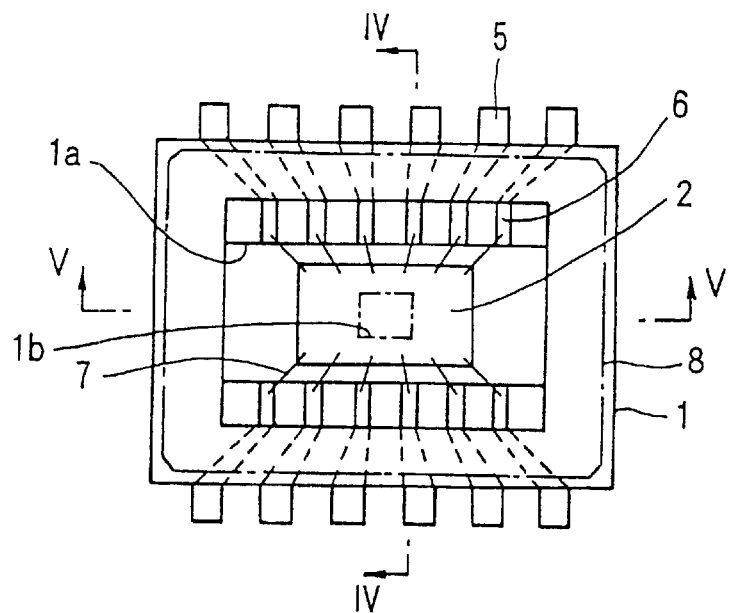
FIG. 3 is a plan view of a solid state imaging device according to a first embodiment of the invention.

FIGS. 3 through 7 illustrate the solid state imaging device according to the first embodiment of the invention. FIG. 3 is a plan view, FIG. 4 a front elevational view, FIG. 5 a side elevational view, FIG. 6 a cross-sectional view taken along the VI—VI line of FIG. 3, and FIG. 7 a cross-sectional view taken along the VII—VII line of FIG. 3.

As shown in FIGS. 3 to 7, the solid state imaging device according to the first embodiment includes a CCD 2 chip bonded to a bottom surface of a cavity 1a in a box-shaped resin-molded package 1 with an adhesive 3. Embedded in the bottom wall of the package 1 under the cavity 1a is a radiator plate 4 having a larger dimension than the CCD chip 2. A rectangular or other formed aperture 1b with a smaller diameter than the CCD chip 2 is formed in the bottom wall of the package 1 in the cavity 1b under the center of the CCD chip 2 for access to a part of the radiator plate 4. The CCD chip 2 is bonded to the radiator plate 4 with an adhesive 3 applied into the aperture 1b.

The larger the dimension of the area of the aperture 1b, the larger the contact area between the CCD chip 2 and the radiator plate 4 via the adhesive 3, resulting in more effective conduction of heat from the CCD chip 2 to the radiator plate 4. Preferably, therefore, the dimension of the aperture 1b is maximized in consideration of other factors.

Numerals 5 and 6 denote outer leads and inner leads respectively which are integrally formed with the package 1. Bonding pads (not shown) of the CCD chip 2 are bonded to the inner leads 6 by wires 7 to electrically connect the CCD chip 2 to the outer leads 5. The package 1 is hermetic sealed by a transparent cap 8 of optical glass or other appropriate material bonded to the top end of the package 1 with an adhesive 9.

The adhesive 3 used to bond the CCD chip 2 to the radiator plate 4 in this embodiment has a thermal conductivity larger than that of the resin forming the package 1. If the resin of the package 1 is epoxy resin, then the adhesive 3 is one containing epoxy resin as its base material and Ag filler as an additional material. When the epoxy resin adhesive containing Ag filler in the ratio of 80% to 90%, the thermal conductivity of the adhesive is $(8-10) \times 10^{-3}$ cal/cm.s.°C., which is four to five times the thermal conductivity, $2.1 \times 10^{-3}$ cal/cm.s.°C., of the epoxy resin forming the package 1.

In this case, the radiator plate 4 is a part of the lead frame used for making the outer leads 5 and the inner leads 6. Preferable materials of the lead frame include iron-nickel alloy containing 42 weight % of nickel (called 42 alloy) and copper-based materials having large thermal conductivities. The thermal conductivity of iron-nickel alloy is 0.03 cal/cm.s.°C., and that of a copper-based material is 0.4 cal/cm.s.°C. These values are as large as more than ten times the thermal conductivity of epoxy resin. Radiation of heat by the radiator plate 4 is very effective when a copper-based material is used as the lead frame.

As explained above, according to the first embodiment, the radiator plate 4 is embedded in the bottom plate of the package 1 under the cavity 1a, and the CCD chip 2 is bonded to the radiator plate 4 with the adhesive 3 having a larger thermal conductivity than the resin of the package and applied into the aperture 1b formed in the package 1 under the center of the CCD chip 2. Therefore, heat generated from the CCD chip 2 during operation is quickly transferred to the radiator plate 4 via the adhesive 3 having a large thermal conductivity, and is eventually discharged from the entirety of the radiator plate 4. As a result, the device can suppress the increase in temperature of the CCD chip 2 during operation, and can minimize problems incurred from an increase in temperature of the CCD chip 2, i.e. an increase in level of defects having a temperature characteristic or deterioration of the quality of images. As a specific example of the temperature suppressing effect, while the CCD chip in the solid state imaging device in the related art exhibits an increase of about 5° C. during operation, the CCD chip in the solid state imaging device according to the first embodiment exhibits an increase of about 2° C. during operation. This is a practically acceptable level.

Since the radiator plate 4 is embedded in the bottom wall of the package 1, light through the transparent cap 8 into the cavity 1a is absorbed by the wall of the package 1 before reaching the radiator plate 4. The device is therefore free from flares or ghosts which might otherwise occur due to reflection of the incident light by the surface of the radiator plate 4.

The radiator plate 4 has an additional function as a moisture resistant plate which prevents infiltration of moisture through the bottom wall of the package 1 into the cavity la and improves the moisture resistant property of the solid state imaging device.

Next explained is the second embodiment of the invention.

Figure 4:
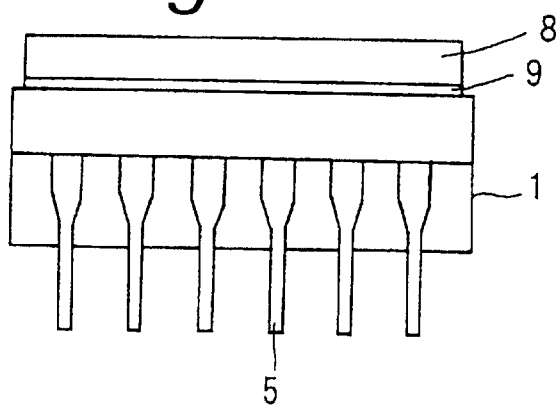
FIG. 4 is a front elevational view of the solid state imaging device according to the first embodiment of the invention.
Figure 5:
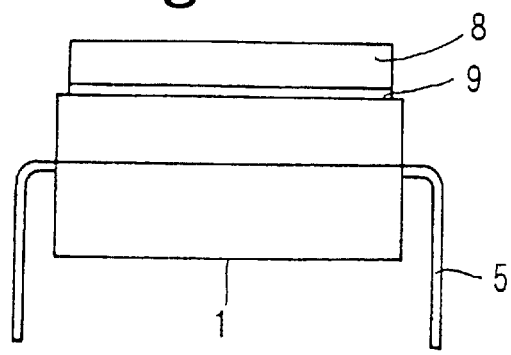
FIG. 5 is a side elevational view of the solid state imaging device according to the first embodiment of the invention.
Figure 6:
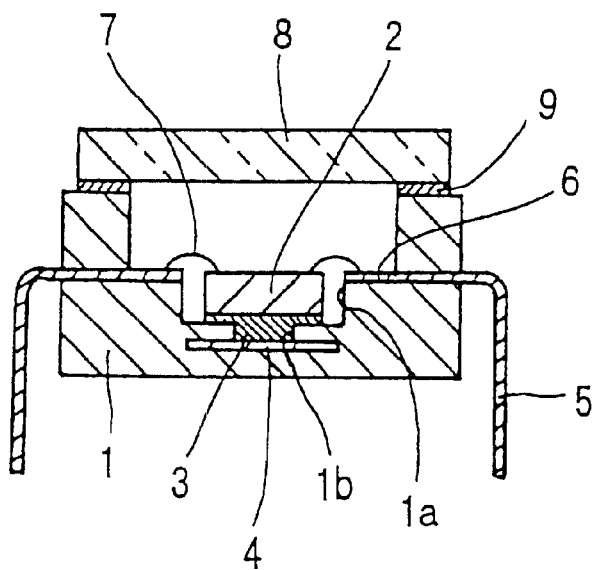
FIG. 6 is a cross-sectional view taken along the VI—VI line of FIG. 3.
Figure 7:
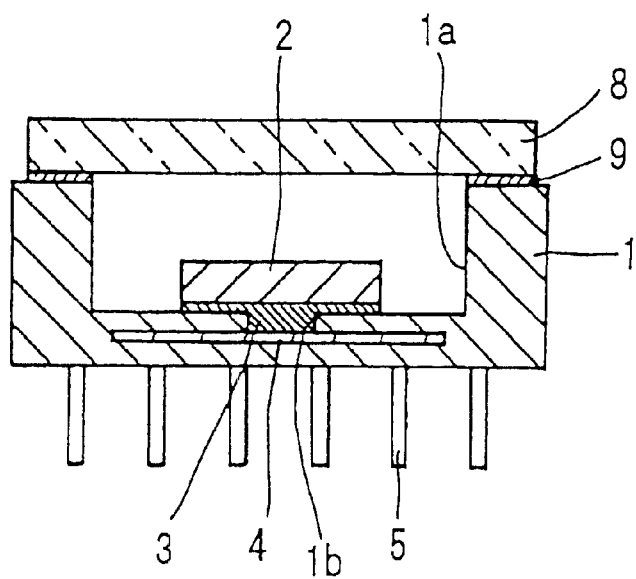
FIG. 7 is a cross-sectional view taken along the VII—VII line of FIG. 3.
Figure 8:
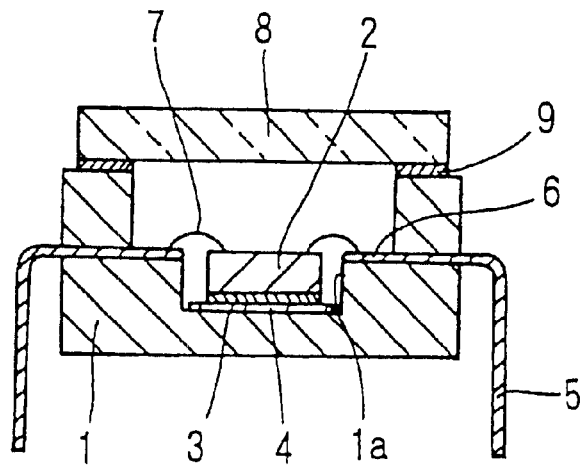
FIG. 8 is a cross-sectional view of a solid state imaging device according to a second embodiment of the invention.
Figure 9:
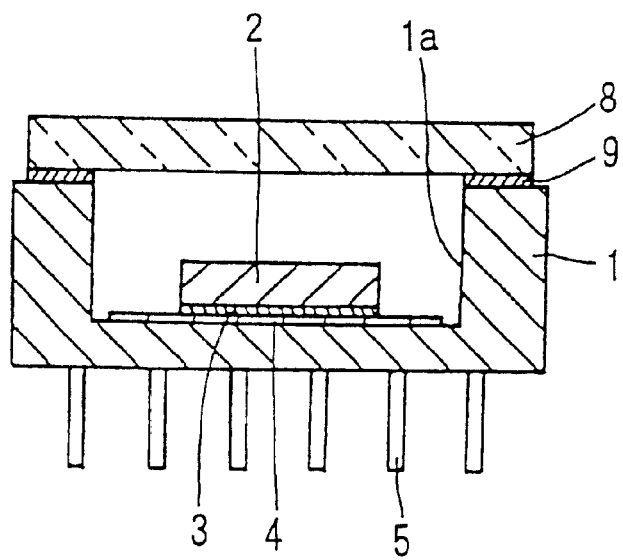
FIG. 9 is a cross-sectional view of the solid state imaging device according to the second embodiment of the invention.

Plan, front elevational and side elevational views of the solid state imaging device according to the second embodiment appear as FIGS. 3, 4 and 5, respectively, and its cross-sectional views corresponding to FIGS. 6 and 7 are as shown in FIGS. 8 and 9.

As shown in FIGS. 3, 4, 5, 8 and 9, the solid state imaging device according to the second embodiment is different from the solid state imaging device according to the first embodiment in that the radiator 4 is provided on and in close contact with the bottom surface of the cavity la in the package 1, with no aperture 1b at the bottom of the cavity 1a. In the other respects, the second embodiment is the same as the first embodiment.

In the second embodiment with the radiator plate 4 appearing on the bottom surface of the cavity 1a in the package 1, ghosts and flares may occur due to reflection of light by the surface of the radiator plate 4. It might be disregarded in solid state imaging devices for use where rough images are acceptable, but it must be overcome in solid state imaging devices which are required to give quality images. A solution is to coat the surface of the radiator plate 4 with a light absorptive material such as Cr to prevent reflection of light. Typically, surface coating of the radiator plate 4 is done only to a selective part of the lead frame used to make the outer leads 5 and the inner leads 6, namely, only the depressed portion of the lead frame to be used as the radiator plate 4. Another solution is to add a certain amount of a black pigment such as carbon and to apply the light absorptive adhesive 3 onto the entire surface of the radiator plate 4.

According to the second embodiment, since the radiator plate 4 is provided on the bottom surface of the cavity 1a in the package 1, with the CCD chip 2 being bonded to the radiator plate 4 with the adhesive 3 having a larger thermal conductivity than the resin of the package 1, the device can suppress the increase in temperature of the CCD chip 2 during operation, and can prevent an increase in level of defects having a temperature characteristic or deterioration of the quality of images. Additionally, by coating the surface of the radiator plate 4 with Cr or other light absorptive material or by applying on the entire surface of the radiator plate 4 the adhesive added with carbon or other black pigment, the device can prevent flares or ghosts which might otherwise occur due to reflection of the incident light by the surface of the radiator plate 4. Further, the radiator plate 4 has an additional function as a moisture resistant plate which prevents infiltration of moisture through the bottom wall of the package 1 into the cavity 1a and improves the moisture resistant property of the solid state imaging device.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, also in the first embodiment, the adhesive 3 may contain carbon or other black pigment to have a light absorptive property so as to prevent reflection of light by the surface of the radiator plate 4 exposed through the aperture 1b at the bottom of the cavity la in the package 1. It is especially effective when the aperture 1b has a large area.

The shape of the package 1 and the number of outer leads 5 and inner leads 6 (the number of pins) shown and described as the first and second embodiments are specified only for an example, but may be modified or changed.

As explained above, the semiconductor device or the solid state imaging device according to the invention attains quick conduction of heat from the semiconductor chip or the solid state imaging element to the radiator plate and effective radiation of heat from the entirety of the radiator plate to the exterior to suppress the increase in temperature of the semiconductor chip or the solid state imaging element during operation by providing in the bottom wall of the package under the cavity or on the bottom surface of the cavity and by bonding the semiconductor chip or the solid state imaging element to the radiator plate with the adhesive having a larger thermal conductivity than the resin of the package.

What is claimed is:

1. A semiconductor device having a semiconductor chip mounted on a bottom surface of a cavity of a hermetic sealed box-shaped resin-molded package, comprising:

a radiator plate provided in a bottom wall of said package under said cavity; and said semiconductor chip and said radiator plate being bonded with an adhesive having a larger thermal conductivity than that of said resin forming said package, wherein said semiconductor chip is bonded to said radiator plate with said adhesive, and wherein said adhesive is applied into and fills an aperture which is formed in the bottom wall of the package in said cavity for access to said radiator plate.

2. The semiconductor device according to claim 1, wherein said package is made of a thermoset resin.

3. The semiconductor device according to claim 1, wherein said resin forming said package is a thermoset resin chosen from epoxy resin, polyimide resin, silicone resin, phenolic resin and unsaturated polyester resin.

4. The semiconductor device according to claim 1, wherein said adhesive having a larger thermal conductivity than the resin forming said package contains a resin chosen from epoxy resin, imide resin, silicone resin and acrylic resin as a base material thereof.

5. The semiconductor device according to claim 1, wherein said adhesive having a larger thermal conductivity than the resin forming said package contains a metal filler.

6. The semiconductor device according to claim 5, wherein said filler is silver.

7. The semiconductor device according to claim 1, wherein said adhesive having a larger thermal conductivity than the resin forming said package contains a black pigment.

8. The semiconductor device according to claim 7, wherein said black pigment is carbon.

9. The semiconductor device according to claim 1, wherein said radiator plate is coated with a light absorptive material.

10. The semiconductor device according to claim 9, wherein said light absorptive material is chromium.

11. The semiconductor device according to claim 1, wherein said radiator plate is a part of a lead frame.

12. The semiconductor device according to claim 1, wherein said radiator plate has a dimension larger than that of said semiconductor chip.

13. The semiconductor device according to claim 1, wherein said semiconductor device is a solid state imaging device.

14. A solid state imaging device having a solid state imaging element on a bottom surface of a cavity in a hermetic sealed box-shaped resin-molded package, comprising:
   a radiator plate provided in the bottom wall of said package under said cavity; and
   said solid state imaging element and said radiator plate being bonded with an adhesive having a larger thermal conductivity than that of the resin forming the package, wherein said solid state imaging element being bonded to said radiator plate with said adhesive, and wherein said adhesive is applied into and fills an aperture which is formed in the bottom wall of the package in said cavity for access to said radiator plate.

15. The solid state imaging device according to claim 14, wherein said package is made of a thermoset resin.

16. The solid state imaging device according to claim 14, wherein said resin forming said package is a thermoset resin chosen from epoxy resin, polyimide resin, silicone resin, phenolic resin and unsaturated polyester resin.

17. The solid state imaging device according to claim 14, wherein said adhesive having a larger thermal conductivity than the resin forming said package contains a resin chosen from epoxy resin, imide resin, silicone resin and acrylic resin as a base material thereof.

18. The solid state imaging device according to claim 14, wherein said adhesive having a larger thermal conductivity than the resin forming said package contains a metal filler.

19. The solid state imaging device according to claim 18, wherein said filler is silver (Ag).

20. The solid state imaging device according to claim 14, wherein said adhesive having a larger thermal conductivity than the resin forming said package contains a black pigment.

21. The solid state imaging device according to claim 20, wherein said black pigment is carbon.

22. The solid state imaging device according to claim 14, wherein said radiator plate is coated with a light absorptive material.

23. The solid state imaging device according to claim 22, wherein said light absorptive material is chromium.

24. The solid state imaging device according to claim 14, wherein said radiator plate is a part of a lead frame.

25. The solid state imaging device according to claim 14, wherein said radiator plate has a dimension larger than that of said solid state imaging element.

26. A semiconductor device having a semiconductor chip on a bottom surface of a cavity in a hermetic sealed box-shaped resin-molded package, comprising:
   a radiator plate which is a part of a lead frame, said radiator plate being provided in the bottom wall of said package under said cavity; and
   said semiconductor chip and said radiator plate being bonded with an adhesive having a larger thermal conductivity than that of the resin forming the package,
   wherein said semiconductor chip is bonded to said radiator plate with said adhesive, and wherein said adhesive is applied into and fills an aperture which is formed in the bottom wall of the package in said cavity for access to said radiator plate.

27. The semiconductor device according to claim 26, wherein said part of a lead frame is a depressed portion.

28. The semiconductor device according to claim 27, wherein said depressed portion of the lead frame is coated with a light absorptive material.

29. The semiconductor device according to claim 28, wherein said light absorptive material is chromium.

30. The semiconductor device according to claim 26, wherein said adhesive contains a black pigment and is applied on the entire surface of said radiator plate.

31. The semiconductor device according to claim 26, wherein said black pigment is carbon.

32. The semiconductor device according to claim 26, wherein said package is made of a thermoset resin.

33. The semiconductor device according to claim 26, wherein said resin forming said package is a thermoset resin chosen from epoxy resin, polyimide resin, silicone resin, phenolic resin and unsaturated polyester resin.

34. The semiconductor device according to claim 26, wherein said adhesive having a larger thermal conductivity than the resin forming said package contains a resin chosen from epoxy resin, imide resin, silicone resin and acrylic resin as a base material thereof.

35. The semiconductor device according to claim 26, wherein said adhesive having a larger thermal conductivity than the resin forming said package contains a metal filler.

36. The semiconductor device according to claim 35, wherein said filler is silver.

37. The semiconductor device according to claim 26, wherein said semiconductor device is a solid state imaging device.

38. A solid state imaging device having a solid state imaging element on a bottom surface of a cavity in a hermetic sealed resin-molded package, comprising:
   a radiator plate provided on the bottom surface of the cavity; and
   an adhesive having a larger thermal conductivity than that of the resin forming the package, bonding said solid state imaging element and said radiator plate, wherein the radiator plate has a larger size than the bottom surface of the solid state imaging element; and
   means for preventing ghosts and flares due to reflection of light from the surface of said radiator plate.

39. A solid state imaging device according to claim 38, wherein said means for preventing ghosts and flares comprises a light absorptive coating on said radiator plate.

40. A solid state imaging device according to claim 38, wherein said radiator plate is part of a lead frame.

41. A solid state imaging device according to claim 38, wherein said adhesive includes a black pigment.

* * * * *